(12) United States Patent
Koen

(10) Patent No.: US 6,998,898 B2
(45) Date of Patent: Feb. 14, 2006

(54) PROGRAMMABLE FRONT END FOR A RECEIVING CHANNEL

(75) Inventor: Myron J. Koen, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 281 days.

(21) Appl. No.: 10/161,129

(22) Filed: May 30, 2002

(65) Prior Publication Data

US 2003/0151417 A1   Aug. 14, 2003

Related U.S. Application Data

(60) Provisional application No. 60/355,965, filed on Feb. 11, 2002.

(51) Int. Cl.
*H03K 5/08* (2006.01)
(52) U.S. Cl. ............................ 327/309; 327/333
(58) Field of Classification Search ........ 327/309–310, 327/313, 318–322, 330, 333
See application file for complete search history.

(56) References Cited

U.S. PATENT DOCUMENTS 4,163,940 A * 8/1979 Brewerton .................. 324/132
5,225,776 A * 7/1993 Dobos et al. ............ 324/121 R

* cited by examiner

*Primary Examiner*—Timothy P. Callahan
*Assistant Examiner*—Cassandra Cox
(74) *Attorney, Agent, or Firm*—W. Daniel Swayze, Jr.; W. James Brady; Frederick J. Telecky, Jr.

(57) ABSTRACT

The present invention discloses a circuit used to couple an input signal to an amplifier circuit. The circuit may contain a diode bridge coupled to an adjustable bias circuit. The current through the bias circuit can be adjusted such that the resistance of the diode bridge can be dynamically configured to change the sensitivity of the diode bridge. The bias circuit may be configured to produce a variable amount of current based on a voltage signal. In another aspect of the present invention, the output from the diode bridge is coupled to an amplifier via a clamp circuit designed to prevent the amplifier from overloading.

10 Claims, 5 Drawing Sheets

PROGRAMMABLE FRONT END FOR A RECEIVING CHANNEL

CROSS-REFERENCE TO RELATED APPLICATIONS

This application claims priority from U.S. Provisional patent Ser. No. 60/355,965, filed Feb. 11, 2002.

FIELD OF INVENTION

This invention generally relates to electric circuits and more particularly to an interface that reduces power dissipation and overload recovery requirements for receivers.

BACKGROUND OF THE INVENTION

Receivers used in various types of circuits are ideally able to handle large signals while maintaining good sensitivity for weak signals. For example, receivers configured to process return echo signals, such as ultrasound signals and radar signals, often encounter both large signals and small signals. An additional desirable feature for receivers is a quick recovery time from overload due to large signals exceeding the capabilities of the receiver. Another desirable feature for these systems is a low amount of power dissipation to reduce the heat produced by the system. Furthermore, there should be some protection against large signals that could possible damage the receiver.

With reference to FIG. 1, a circuit schematic of a receiving channel 100 of a prior art ultrasound system is presented. Receiving channel 100 generally includes a transducer section configured to transmit ultrasound excitation signals and receive a return echo signal. The return signal is propagated to a bridge section, which is biased to a certain level. The return signal is then propagated to an amplification section to bring the signal to a level where it can be processed by other devices. Typically, the signal is clamped to a predetermined level that does not overload the amplification section.

With further reference to FIG. 1, an exemplary embodiment of the present invention is illustrated. A transducer section typically comprises a transducer 102 configured to transmit ultrasound signals and receive a return echo. The signal used to excite transducer 102 and generate the high frequency sound pulses is applied through diodes 106 and 108. Diodes 106 and 108 are configured to steer the high excitation voltage into transducer 102, and block the relatively small return signals caused by the return echo received by transducer 102 from propagating to the rest of the circuit.

The bridge section receiving the return signal (i.e., the echoed signal) comprises a diode bridge comprising diodes 110, 112, 114, and 116 to help steer the current. The diode bridge is biased by a resistor 118 in series with an inductor 119, coupled to a positive power supply 111 and a resistor 120 in series with an inductor 121, coupled to a negative power supply 113. Diodes 122 and 124 limit the signal that propagates to the remainder of the circuit to +/− one diode voltage drop (e.g., 0.7 to 0.8 volts).

The signal from the diode bridge then propagates to low noise amplifier 126, voltage controlled amplifier 128, and post-amplifier 130. From this point, the signal can be processed by various systems to create a video image suitable for display on a video monitor.

With reference to FIG. 3A, an exemplary pulse transmitted to transducer 102 is shown. It can be seen that a short pulse with both positive and negative components is input to receiving channel 100, followed by a zero volt signal until the next pulse is due (in approximately 50 to 250 microseconds ($\mu s$)).

There are several potential problems with the above-described receiving channel 100. For example, there is relatively large power dissipation present. In order to have good sensitivity in the receiving channel, a high bias current may be used to lower the resistance of the diode bridge, in turn lowering the noise level. The voltage supplies 111 and 113 of the prior art system are typically configured to be +/−15 volts. Diodes 110, 112, 114, and 116 are typically biased with a relatively high current, e.g., 10 milliamps ("mA"). Thus, the power dissipation is approximately 300 milliwatts ("mW"). When multiple sensing channels are used, such a power dissipation is proportionately increased by the number of channels used. Such a power dissipation may result in various undesirable heat problems.

In addition, in the embodiment of FIG. 1, low noise amplifier 126 typically has a voltage gain of approximately 10. Since system 100, as a whole, is typically configured to output about 2 volts, it may be desirable to limit the input to low noise amplifier 126 to approximately 0.2 volts to prevent an internal overload. However, the input to low noise amplifier 126 is only limited by the turn-on voltage of diodes 122 and 124 (approximately 0.8 volts). Therefore, a signal greater than 0.2 volts but less than 0.8 volts will propagate to low noise amplifier 126, possibly resulting in an overload of amplifier 126.

SUMMARY OF THE INVENTION

A programmable receiver front-end that alleviates the problems of the prior art is disclosed. The receiver front-end contains a programmable bias circuit and a variable clamp circuit coupled to the receiving circuit. The bias circuit may comprise a transistor circuit that can be controlled via a control voltage to produce the desired amount of bias. The variable clamp circuit may comprise a transistor coupled to a control voltage to provide a variable amount of resistance. In another embodiment, the variable clamp circuit may comprise an amplifier with a resistance element in a feedback circuit.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

DETAILED DESCRIPTION

The present invention may be described herein in terms of various functional components and various processing steps. It should be appreciated that such functional components may be realized by any number of hardware or structural components configured to perform the specified functions. For example, the present invention may employ various integrated components comprised of various electrical devices, e.g., resistors, transistors, capacitors, diodes and the like, whose values may be suitably configured for various intended purposes. In addition, the present invention may be practiced in any integrated circuit application where an apparatus to handle a large range of input signals is desired. Such general applications that may be appreciated by those skilled in the art in light of the present disclosure are not described in detail herein. However, for purposes of illustration only, exemplary embodiments of the present invention will be described herein in connection with a front end receiving channel for ultrasonic systems. Further, it should be noted that while various components may be suitably coupled or connected to other components within exemplary circuits, such connections and couplings can be realized by direct connection between components, or by connection through other components and devices located therebetween.

Figure 4:
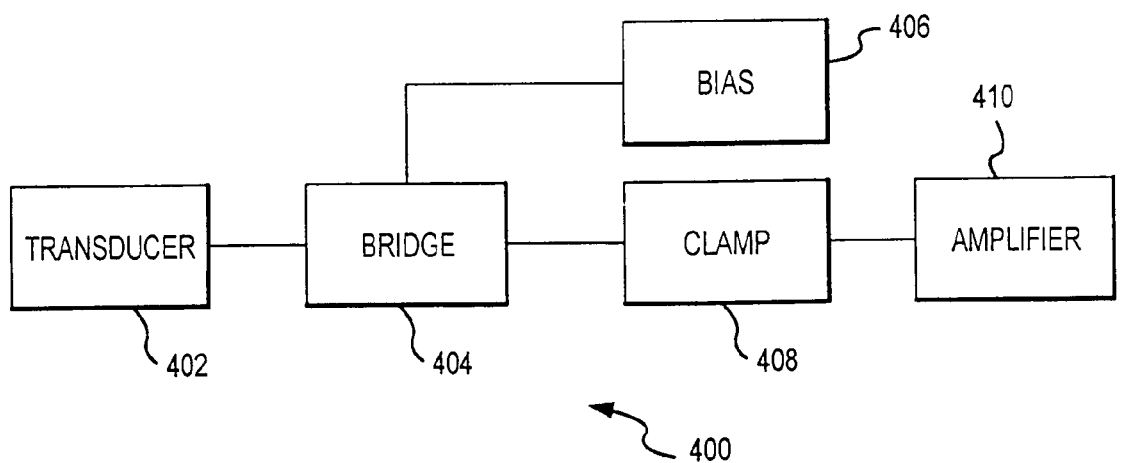
FIG. 4 shows a block diagram of a general receiving channel.

An embodiment of the present invention features an improved bias circuit. With reference to FIG. 4, bias circuit 406 provides the bias current necessary for bridge circuit 404 to operate properly. In receiving channel 100 of FIG. 1, the bias current is fixed, as the bias circuit merely comprises resistors and inductors coupled to positive and negative voltage sources. An embodiment of the present invention uses a bias circuit 406 that is configured to produce a variable amount of bias current to result in a more efficient circuit. The amount of current provided via bias circuit 406 is preferably configured such that the bias current can be controlled to be low when a low sensitivity is needed, but raised to a higher current level when a high sensitivity is needed.

With reference to FIG. 4, a block diagram of an exemplary single receiving channel within an ultrasound receiver is presented. A transducer 402 is configured to transmit ultrasound signals and receive a return echo. It should be understood that, in an ultrasound system used for medical imaging, transducer 402 is typically held against the body of a human patient. Transducer 402 transmits high frequency sound pulses into the body. The sound pulses reflect off of various parts, e.g., body tissues, of the body and a return echo portion is reflected back to transducer 402. By measuring the time for the return echo to reach transducer 402, the distance from the probe to a certain tissue can be calculated. This return echo is processed by various circuits and an image representing the return echo is displayed. The return echo signal is transmitted to a bridge 404, which is biased via bias circuit 406. Bridge 404 serves to protect the receiver from damage. The signal is then transmitted to clamp circuit 408, which is configured to prevent an excessive signal from passing through, and to amplifier 410.

Figure 1:
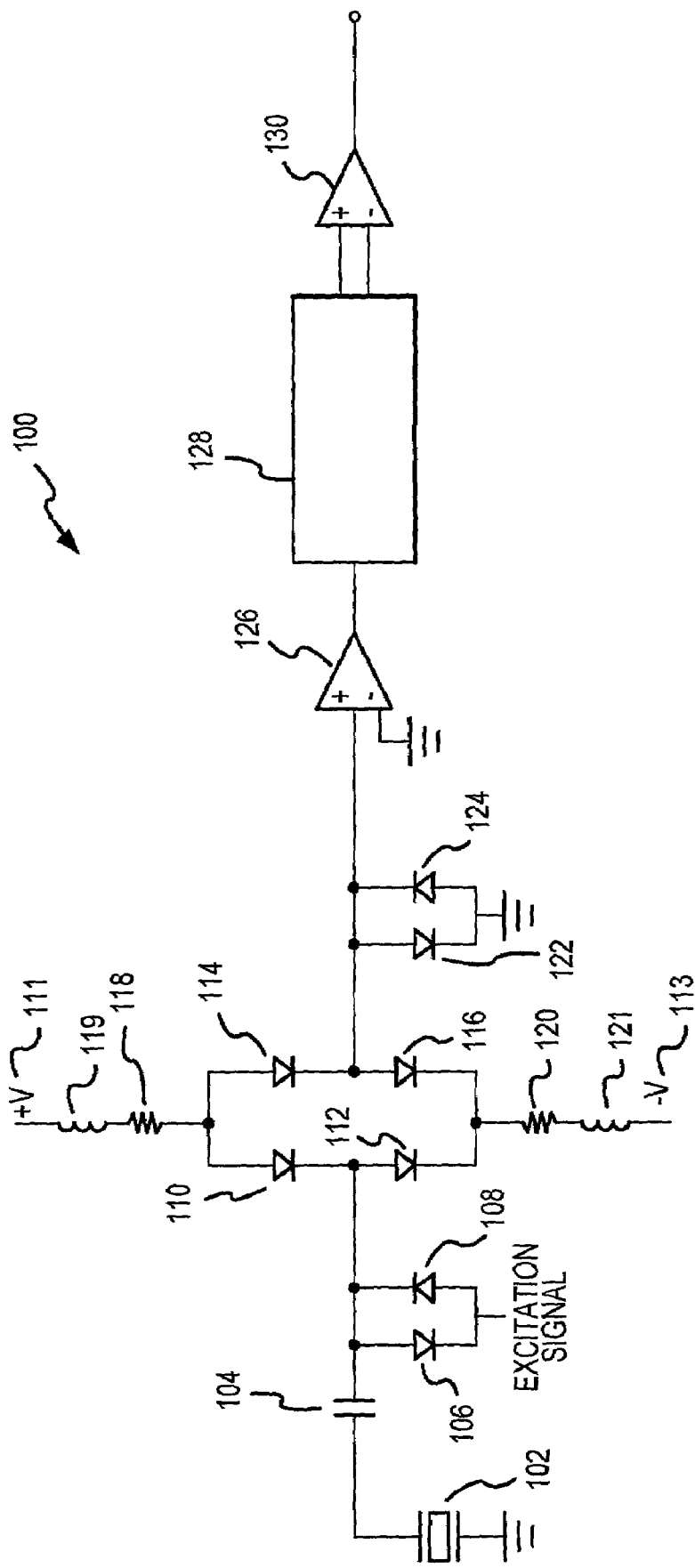
FIG. 1 shows the schematic of a prior art receiving channel within a receiver for an ultrasound system.
Figure 2:
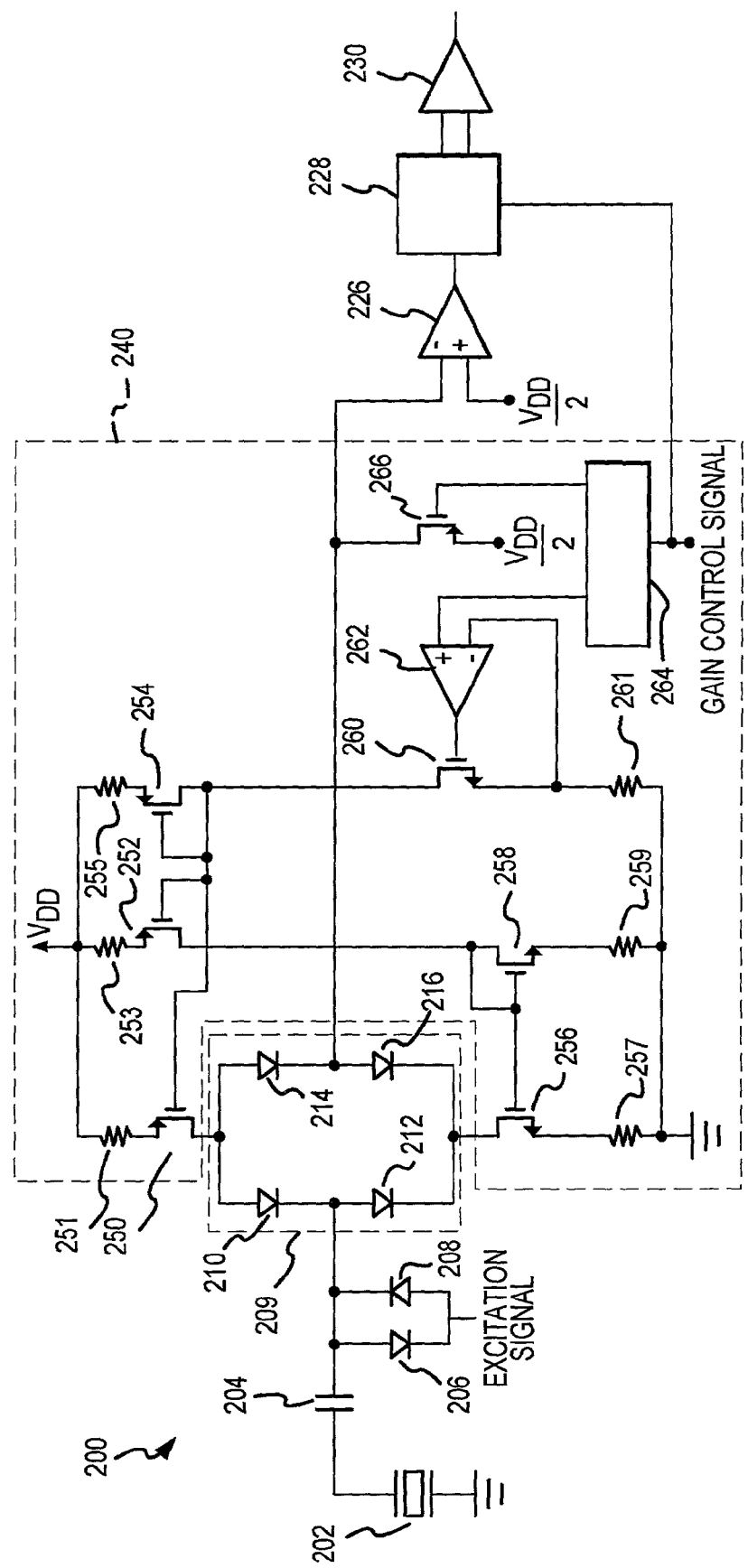
FIGS. 2 and 2A show a schematic of a receiving channel of a receiving channel of the present invention.

With reference to FIG. 2, an exemplary embodiment of a receiving channel is illustrated. Transducer 202 is configured to transmit ultrasound signals and receive a return echo signal. The signal used to excite transducer 202 and generate the high-frequency sound pulses is applied through diodes 206 and 208. Diodes 206 and 208 steer the high excitation voltage into transducer 202, but block the relatively small return echo signal received by transducer 202. The return echo signal is received through a diode bridge 209 comprising diodes 210, 212, 214, and 216. In a similar manner, amplifier 226, voltage controlled attenuator 228, and post-amplifier 230 operate analogously to elements 126, 128, and 130, respectively, of FIG. 1. The diode bridge is coupled to the power supplies via bias circuit 240.

Figure 3A:
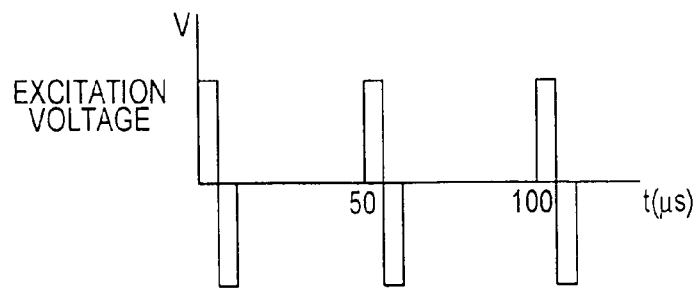
FIG. 3A is a graph showing an excitation pulse transmitted via a transducer.

Bias circuit 240 is configured to provide a mechanism to program the bias current supplied to the diode bridge. For example, as described above with respect to FIG. 3A, after an ultrasonic pulse is sent to transducer 202, there is a time period during which no signal is transmitted, to enable receiving channel 200 to receive and process the return echo. At the beginning of the cycle, it may not be necessary to provide high sensitivity. Therefore, the bias current for diode bridge 209 can be reduced to consume less power. As the time period continues, the current through the diode bridge can be increased to achieve a desired level of sensitivity.

Transistors 250 and 256 bias diode bridge 209. By varying a control signal applied to the positive input of amplifier 262, the current through transistor 260 can be adjusted. The current mirror action of transistors 254 and 252 feeds transistor 258, thereby allowing the current through both transistor 250 and transistor 256 to be dynamically changed. The circuit that is represented by N-channel FET 260 and amplifier 262, along with resistor 261, comprise a voltage to current converter. The current that flows through resistor 261 ("$I_x$") is equal to the quotient of the gain control voltage divided by the resistance of resistor 261. This same current $I_x$ flows through transistor 254, causing a current ("$I_y$") to flow through transistor 250. A current ("$I_z$") then flows through transistors 252 and 258, causing a current ("$I_a$") to flow through transistor 256. In a preferred embodiment, $I_a = I_y$.

Figure 3B:
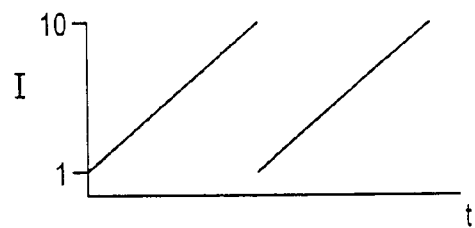
FIG. 3B is a graph illustrating the bias current in an embodiment of the present invention.

Through the use of the above-described transistor bias network 240, the bias current can be dynamically adjusted through the application of a signal to amplifier 262. As explained above, it is not necessary to have good sensitivity at the beginning of a cycle (immediately following the transmission of a pulse). Thus, with reference to FIG. 3B, instead of a fixed high bias current of 10 mA, the bias current can be as low as 1 mA at the beginning of a cycle. As the cycle progresses, the bias current can be increased until it is about 10 mA. Thus, the average bias current is only about 5.5 mA.

Another aspect of the present invention is that transistor 266 can be programmed to attenuate the input to amplifier 226 to prevent overloading. As described above with respect to FIG. 1, a signal greater than 0.2 volts but less than 0.8 volts will propagate to low noise amplifier 126, possibly resulting in an overload of amplifier 126.

Through the use of a programmable transistor 266 (in lieu of diodes 122 and 124), the clamping can be controlled such that the signal level is within the dynamic capability of amplifier 226. The source of transistor 266 may be coupled to a voltage that is half the supply voltage in order to further bias the operation of transistor 266. Through the controlling of the voltage at the gate of transistor 266 (via signal conditioner 264), the resistance of transistor 266 can be configured such that voltages higher than a specific amount (such as 0.2 volts) can be clamped to prevent low noise amplifier 226 from overloading. By avoiding an overload condition, a recovery period is avoided. Thus, circuit 200 of FIG. 2 has a higher availability rate than does circuit 100 of FIG. 1. In a typical situation, the gain of receiving channel 200 is programmed to initially be low, and then to increase with time. Signal conditioner 264 uses the gain control signal to vary the current Ix, described above, and to adjust the resistance of transistor 266 such that the sensitivity is compatible with the loss of attenuator 228.

Signal conditioner 264 is configured to translate a gain control signal in such a way that the resistance of transistor 266 increases as the current through transistor 260 increases. When the gain control signal is low, the voltage at the gate of transistor 266 becomes low, thereby causing the resistance of transistor 266 to reach a minimum level. As the gain control signal increases in voltage, the resistance of transistor 266 increases. As the voltage of the gain control signal may vary from 0 to 3 volts, is may be desirable to alter the input to amplifier 262 such that the voltage varies between two values to cause the current through transistor 260 to vary between two values (e.g., 1 mA and 10 mA).

Figure 5:
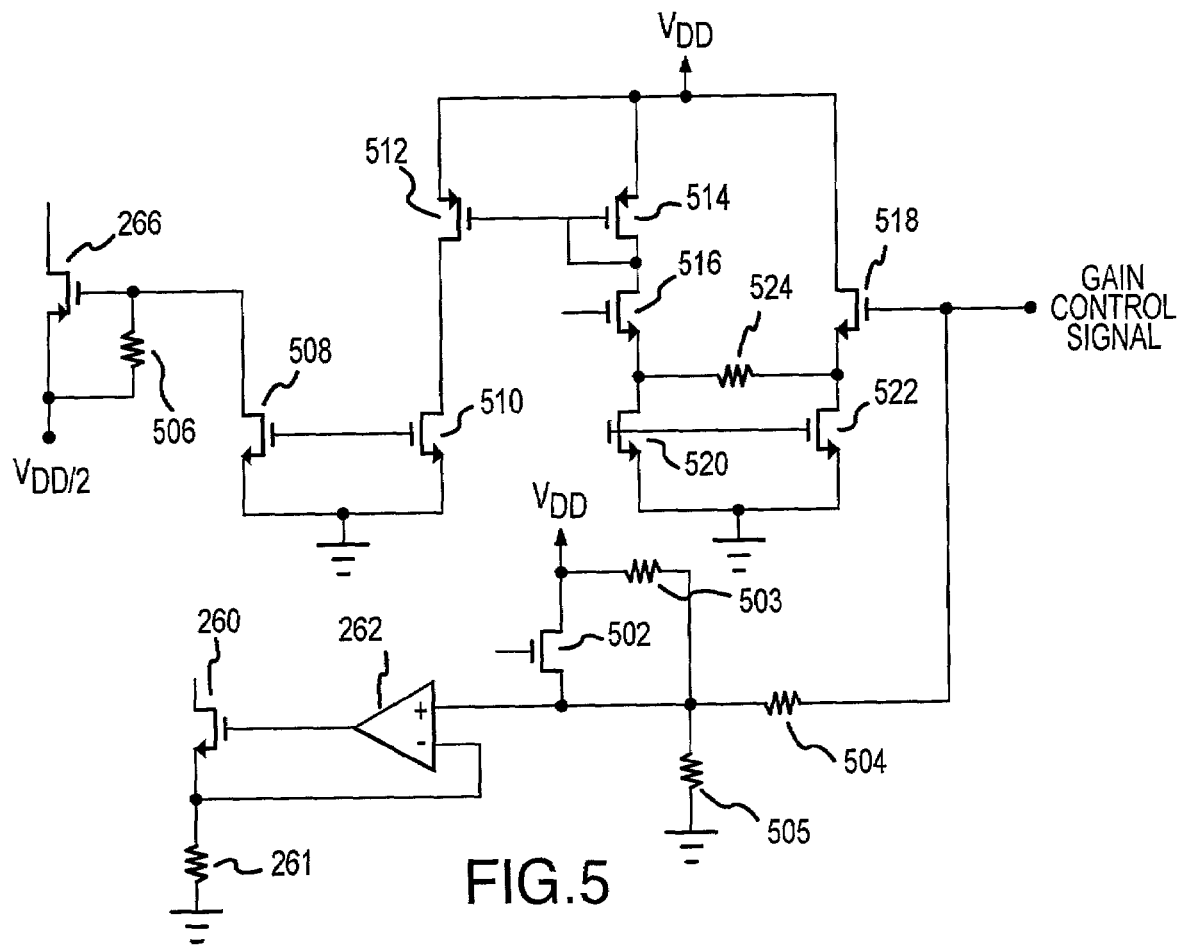
FIG. 5 illustrates a circuit schematic of an exemplary signal conditioner of the present invention.

An exemplary schematic of signal conditioner 264 is illustrated in FIG. 5. The gain control signal is applied to resistor 504 to provide a bias to transistor 502. Transistor 502 acts to attenuate the signal before being applied to amplifier 262. In addition, the gain control signal is applied to transistor 518, and the circuit comprising transistors 516, 518, 520, 522, 512, 514, 508, and 510 is configured to decrease the resistance of transistor 266 as the current through transistor 260 increases.

The configuration of circuit 200 leads to a number of advantages over the prior art. For example, in FIG. 1, the power supplies 111 and 113, inductors 119 and 121, and resistors 118 and 120 are used to emulate a current source. Thus, in order to produce the desired amount of current, a large voltage (e.g., +/−15 volts) is typically used. In contrast, in the circuit of FIG. 2, transistors 250 and 256 supply the current to the bridge circuit. Because of the characteristics of transistors 250 and 256, a bias voltage of only 5 volts is required to produce an amount of current similar to that used the receiving channel of FIG. 1. In addition, transistors 250 and 256 do not require an inductor to better emulate a current source.

Thus, as described above, circuit 100 of FIG. 1 dissipates approximately 300 mW. With the embodiment shown in FIG. 2, a standing current of 1 mA can be used, resulting in an average current of about 5 mA. Because the embodiment shown in FIG. 2 can be used in a circuit using a 5 volt power supply, the average power dissipation is only 25 mW, one-twelfth of the power dissipation of the circuit shown in FIG. 1.

An additional advantage is that the circuit of FIG. 2 is simpler than the circuit of FIG. 1. As can be seen in FIG. 1, there are various inductors associated with the protection network of FIG. 1. Such elements are not necessary in the embodiment of FIG. 2, thus leading to a great simplification of the circuit and a greater ease in fabricating an integrated circuit with the circuit of FIG. 2.

A further improvement is a reduced recovery time. As explained above, the use of transistor 266 and signal conditioner 264 in lieu of diodes 122 and 124 results in a greater prevention of overload to the receiver unit, lessening the need for a time-consuming recovery period. Because there are fewer recovery periods present in an embodiment of the present invention, there is a smaller amount of time spent in recovery.

It should be understood that the circuit of FIG. 2 is merely exemplary and there may be several different circuits possible that perform the functions of bias circuit 240. The function of bias circuit 240 is to convert a voltage to two equal and opposite currents that are used to bias the bridge 210, 212, 214, and 216. Various other designs which produce a similar result may also be used in lieu of circuit 240 shown in FIG. 2.

Figure 2A:
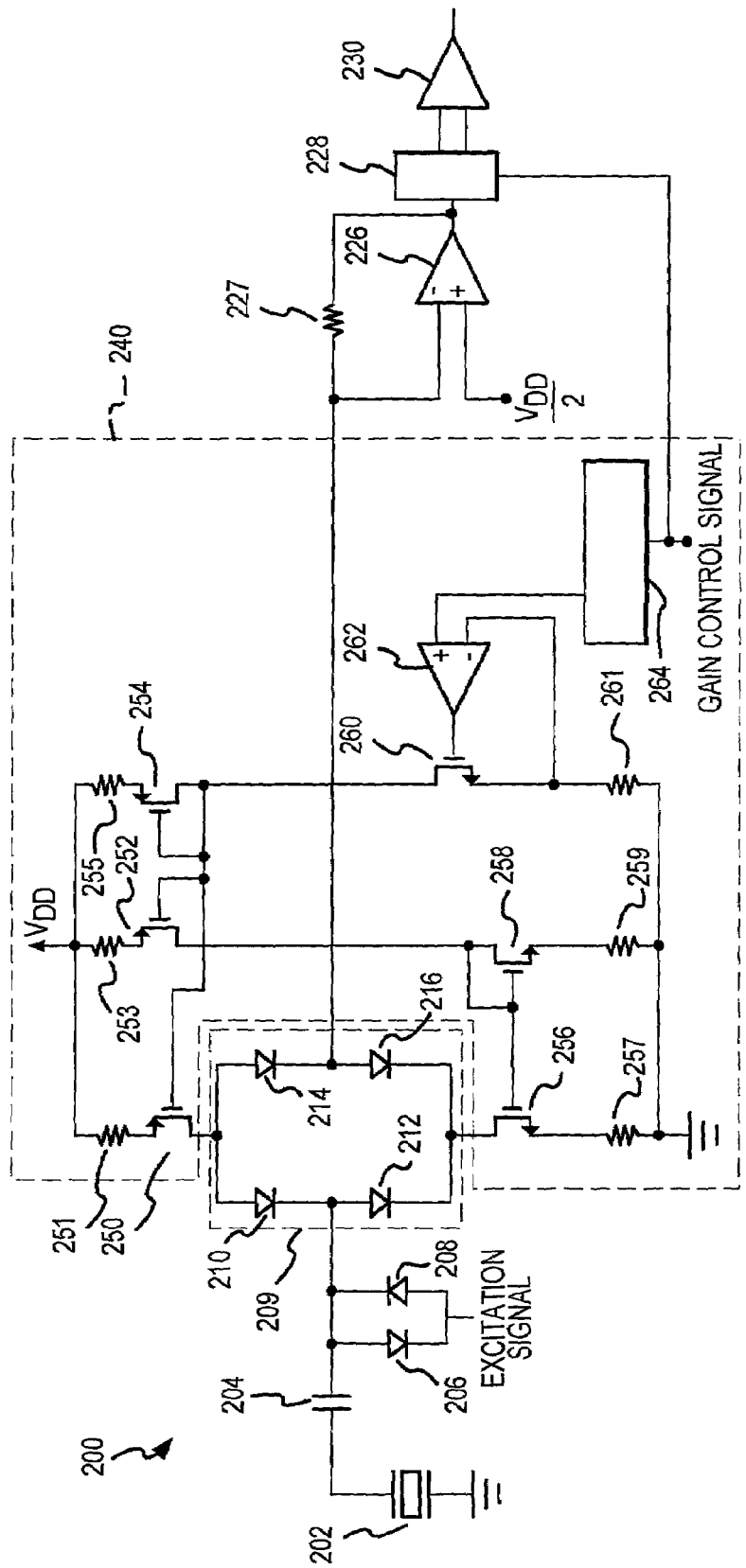

For example, an alternative embodiment of the present invention is illustrated in FIG. 2A. While the circuit is configured similarly to FIG. 2, there are differences in the interface with amplifier 226. In lieu of a transistor acting as a variable resistance element, a resistor 227 is placed in a negative feedback path of amplifier 226. In such a manner, the maximum output voltage from amplifier 226 would be the product of the resistance of resistor 227 and the maximum current flowing through transistors 250 and 256. Because the maximum current level is controlled, via signal conditioner 264, the maximum output voltage from amplifier 226 would also be controlled and kept within the linear operating region of amplifier 226.

The above description presents exemplary modes contemplated in carrying out the invention. The techniques described above are, however, susceptible to modifications and alternate constructions from the embodiments shown above. Other variations and modifications of the present invention will be apparent to those of ordinary skill in the art, and it is the intent of the appended claims that such variations and modifications be covered. For example, in FIG. 2, CMOS devices are shown for transistors 250, 252, 254, 256, 258, and 260. These could be replaced by bipolar devices. In addition, diodes 210, 212, 214, and 216 may be suitably replaced by CMOS transistors or bipolar transistors connected as diodes.

Consequently, it is not the intention to limit the invention to the particular embodiments disclosed. On the contrary, the invention is intended to cover all modifications and alternate constructions falling within the scope of the invention, as expressed in the following claims when read in light of the description and drawings. No element described in this specification is necessary for the practice of the invention unless expressly described herein as "essential" or "required."

I claim:

1. A circuit for interfacing between a transducer and an amplifier comprising:
    a diode bridge;
    a variable bias circuit coupled to the diode bridge; and
    a variable clamp circuit,
    wherein the variable clamp circuit comprises a resistance element coupled to a signal conditioner, and
    wherein the signal conditioner is configured to translate a voltage signal into a current signal.

2. The circuit of claim 1 wherein said resistance element comprises a FET comprising a gate, a source, and a drain;
    wherein said signal conditioner is coupled to the gate of said transistor;
    wherein the drain of said transistor is coupled to a voltage to be clamped; and
    wherein the source of said transistor is coupled to a fixed voltage source.

3. The circuit of claim 1 wherein said bias circuit comprises:
    a first transistor coupled to a positive voltage supply;
    a second transistor coupled to a ground;
    a current mirror circuit coupled to both said first and second transistors.

4. The circuit of claim 3 wherein the current mirror circuit is coupled to an op-amp.

5. The circuit of claim 4 wherein the op-amp is coupled to a signal conditioner.

6. The circuit of claim 5 wherein said signal conditioner is further coupled to said variable clamp circuit.

7. A method of coupling an amplifier to an input signal comprising:

inputting the input signal into a diode bridge; and
biasing the diode bridge via an adjustable bias circuit;
clamping said signal; and
transmitting said signal into said amplifier,
wherein said biasing step is configured to provide a low amount of bias current when a low sensitivity is desired and to provide a high amount of bias current when a high sensitivity is desired.

8. The method of claim 7 wherein said clamping step comprises coupling a transistor to said signal; and
configuring said transistor via a control circuit.

9. The method of claim 8 further comprising:
adjusting the adjustable bias circuit based on said control circuit.

10. The method of claim 7 wherein:
said clamping step is configured to prevent a high voltage signal from overloading said amplifier.

* * * * *